(12) United States Patent
Chen et al.

(10) Patent No.: US 11,086,360 B2
(45) Date of Patent: Aug. 10, 2021

(54) SEMICONDUCTOR PACKAGE

(71) Applicant: Powerchip Semiconductor Manufacturing Corporation, Hsinchu (TW)

(72) Inventors: Chun-Liang Chen, Hsinchu County (TW); Hann-Jye Hsu, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/796,911

(22) Filed: Feb. 20, 2020

(65) Prior Publication Data

US 2021/0208632 A1 Jul. 8, 2021

(30) Foreign Application Priority Data

Jan. 6, 2020 (TW) .................................. 109100303

(51) Int. Cl.
*G06F 1/16* (2006.01)
*G02F 1/1345* (2006.01)
(Continued)

(52) U.S. Cl.
CPC ........ *G06F 1/1637* (2013.01); *G02F 1/13452* (2013.01); *G09F 9/301* (2013.01);
(Continued)

(58) Field of Classification Search
CPC ........... G06F 1/1637; G06F 2200/1612; G02F 1/13452; H05K 1/189; H05K 1/028; H05K 1/147; H05K 3/007; H05K 3/10; H05K 3/32; H05K 2201/10015; H05K 2201/10022; H05K 2201/1003; H05K 2201/10174; H05K 2201/10287; G09F 9/301; H01L 27/3276; H01L 51/0097;
(Continued)

(56) References Cited

U.S. PATENT DOCUMENTS

| 5,726,726 A | 3/1998 | Nakanishi |
| 9,059,106 B2 | 6/2015 | Daubenspeck et al. |

(Continued)

FOREIGN PATENT DOCUMENTS

| CN | 1782785 | 6/2006 |
| CN | 104994690 | 10/2015 |

(Continued)

OTHER PUBLICATIONS

"Office Action of Taiwan Counterpart Application", dated Sep. 30, 2020, p. 1-p. 9.

(Continued)

*Primary Examiner* — Steven T Sawyer
(74) *Attorney, Agent, or Firm* — JCIPRNET

(57) ABSTRACT

The present disclosure provides a semiconductor package including a substrate, a display unit, a driving circuit, and at least one of memory. The substrate has a display region and a peripheral region. The display unit is disposed in the display region and electrically connects with the display unit. The memory is disposed in the peripheral region and electrically connected with the driving circuit. The driving circuit and the memory are spaced apart from each other.

10 Claims, 3 Drawing Sheets

(51) Int. Cl.
*H05K 1/18* (2006.01)
*G09F 9/30* (2006.01)
*H05K 1/14* (2006.01)

(52) U.S. Cl.
CPC .............. *H05K 1/147* (2013.01); *H05K 1/189* (2013.01); *G06F 2200/1612* (2013.01)

(58) Field of Classification Search
CPC ....... H01L 2251/5338; H01L 2227/323; H01L 2227/326; Y02E 10/549; Y02P 70/50
See application file for complete search history.

(56) References Cited

U.S. PATENT DOCUMENTS

| | | | |
|---|---|---|---|
| 2003/0184550 A1* | 10/2003 | Nally | G09G 5/393 |
| | | | 345/531 |
| 2004/0252086 A1* | 12/2004 | Matsuda | G09G 3/3216 |
| | | | 345/76 |
| 2005/0001211 A1* | 1/2005 | Yamazaki | H01L 27/124 |
| | | | 257/52 |
| 2008/0252588 A1* | 10/2008 | Huang | G09G 3/20 |
| | | | 345/100 |
| 2008/0273005 A1* | 11/2008 | Chen | G09G 3/3413 |
| | | | 345/102 |
| 2011/0254758 A1* | 10/2011 | Lin | G02B 26/001 |
| | | | 345/84 |
| 2014/0111953 A1* | 4/2014 | McClure | G06F 3/0443 |
| | | | 361/749 |
| 2016/0063659 A1* | 3/2016 | Jangda | G09G 3/2092 |
| | | | 345/522 |
| 2017/0215288 A1* | 7/2017 | Shi | H01L 27/3276 |
| 2019/0073961 A1* | 3/2019 | Park | G09G 3/2092 |
| 2019/0259340 A1* | 8/2019 | Wu | G09G 3/3275 |
| 2020/0082745 A1* | 3/2020 | Tung | G09G 3/2096 |

FOREIGN PATENT DOCUMENTS

| | | |
|---|---|---|
| TW | M289225 | 4/2006 |
| TW | 201417267 | 5/2014 |
| TW | 201640487 | 11/2016 |
| TW | 201734593 | 10/2017 |

OTHER PUBLICATIONS

"Office Action of Taiwan Counterpart Application", dated Jun. 3, 2021, p. 1-p. 9.

* cited by examiner

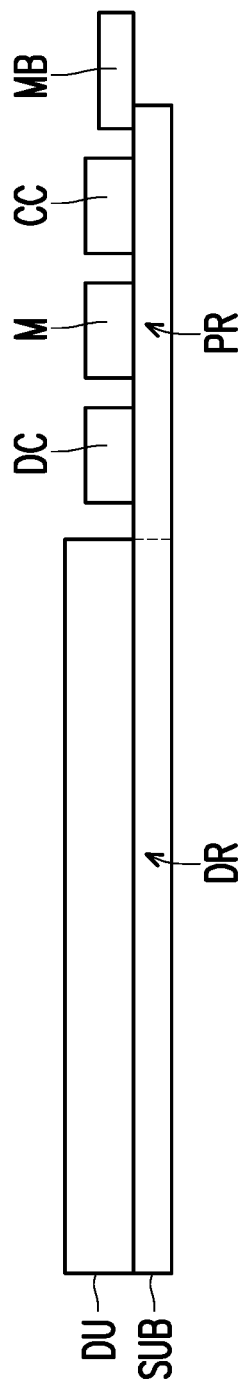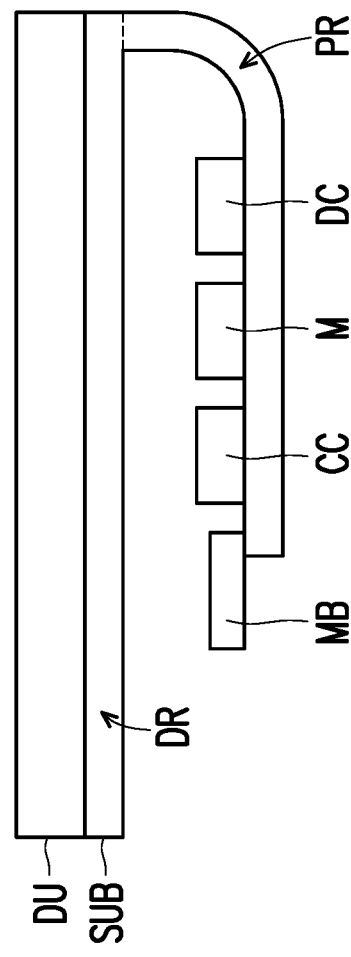

SEMICONDUCTOR PACKAGE

CROSS-REFERENCE TO RELATED APPLICATION

This application claims the priority benefit of Taiwan application serial no. 109100303, filed on Jan. 6, 2020. The entirety of the above-mentioned patent application is hereby incorporated by reference herein and made a part of this specification.

BACKGROUND OF THE INVENTION

1. Field of the Invention

The invention relates to a package structure, and more particularly, to a semiconductor package.

2. Description of Related Art

With the advance of display technology, the requirement for a driver with high operation speed is increased, therefore, various semiconductor packages have been developed to provide a driver with integrated circuits (ICs) having high degree of integration. For example, a general semiconductor package for driving the display unit may be, for example, a chip on glass (COG), a tape carrier package (TCP), or a chip on film (COF). Recently, as the users require higher display quality (e.g. image resolution, color saturation, and the like), the data to be processed by the driver is increased. As such, defects caused by image delay may be occurred on the display image because the time required to process the data is too long.

SUMMARY OF THE INVENTION

The invention provides a semiconductor package that can have high operation speed, low power consumption, and good process flexibility.

An embodiment of the invention provides a semiconductor package including a substrate, a display unit, a driving circuit, and at least one memory. The substrate has a display region and a peripheral region. The display unit is disposed in the display region. The driving circuit is disposed in the peripheral region and electrically connected with the display unit. The at least one memory is disposed in the peripheral region and electrically connected with the driving circuit. The driving circuit and the at least one memory are spaced apart from each other.

According to an embodiment of the invention, in the semiconductor package, the at least one memory is electrically connected with the driving circuit through a wiring structure of the substrate.

According to an embodiment of the invention, in the semiconductor package, the at least one memory is electrically connected with the driving circuit through a mobile industry processor interface (MIPI).

According to an embodiment of the invention, in the semiconductor package, the at least one memory includes a plurality of memories spaced apart from each other.

According to an embodiment of the invention, in the semiconductor package, the display region and the peripheral region are configured at the same level.

According to an embodiment of the invention, in the semiconductor package, the display region and the peripheral region are configured at the different level.

According to an embodiment of the invention, in the semiconductor package, the peripheral region is configured below the display region, and the display unit overlaps with the at least one memory and the driving circuit.

According to an embodiment of the invention, the semiconductor package further includes a main board electrically connected with the at least on memory and the driving circuit respectively.

According to an embodiment of the invention, the semiconductor package further includes a control circuit disposed in the peripheral region and electrically connected with the driving circuit and the main board respectively.

According to an embodiment of the invention, in the semiconductor package, the control circuit is spaced from the at least one memory and the driving circuit.

According to an embodiment of the invention, in the semiconductor package, the control circuit includes a logic integrated circuit, an analog integrated circuit, or a combination thereof.

According to an embodiment of the invention, in the semiconductor package, the substrate includes a flexible substrate or a rigid substrate.

According to an embodiment of the invention, in the semiconductor package, the driving circuit includes a source driving circuit.

According to an embodiment of the invention, in the semiconductor package, the memory includes a static random access memory (SRAM), a pseudo-SRAM, a dynamic random access memory (DRAM), a flash memory, an electrically erasable and programmable read only memory (EEPROM), or a combination thereof.

According to an embodiment of the invention, in the semiconductor package, the display unit comprises a liquid crystal display (LCD), an organic light emitting diode (OLED), a Mini-LED display, or a Micro-LED display.

Based on the above, the memory and the driving circuit of the semiconductor package of the present invention are disposed in the peripheral region and electrically connected to each other, so that the driving circuit can process a large amount of image data. As a result, the semiconductor package may have characteristics of high operation speed and low power consumption so as to meet the frame rate requirement of the display unit having high resolution and high quality.

On the other hand, since the driving circuit and the memory can be manufactured respectively through different processes and then disposed in the peripheral region of the substrate, the semiconductor package may have good process flexibility in the case where the processes of the driving circuit and the memory are separated.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3 is a cross-sectional view of the semiconductor package according to still another embodiment of the invention.

FIG. 4 is a cross-sectional view of the semiconductor package according to yet another embodiment of the invention.

DESCRIPTION OF THE EMBODIMENTS

Figure 1:
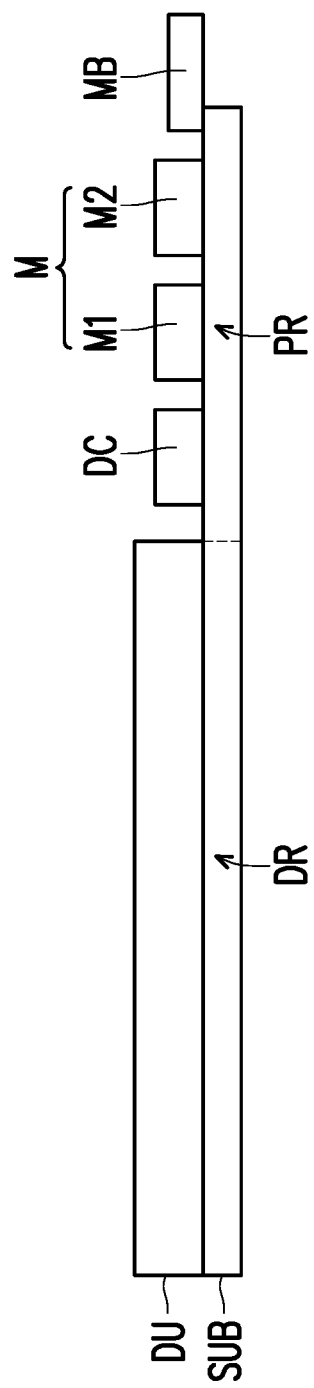
FIG. 1 is a cross-sectional view of the semiconductor package according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements. As used herein, "electrical connection" may refer to the concept including a physical connection (e.g., wiring) and a physical disconnection (e.g., wireless connection). For example, the electrical connection may include a general connection of wiring as described above, or an interface connection through MIPI.

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 2:
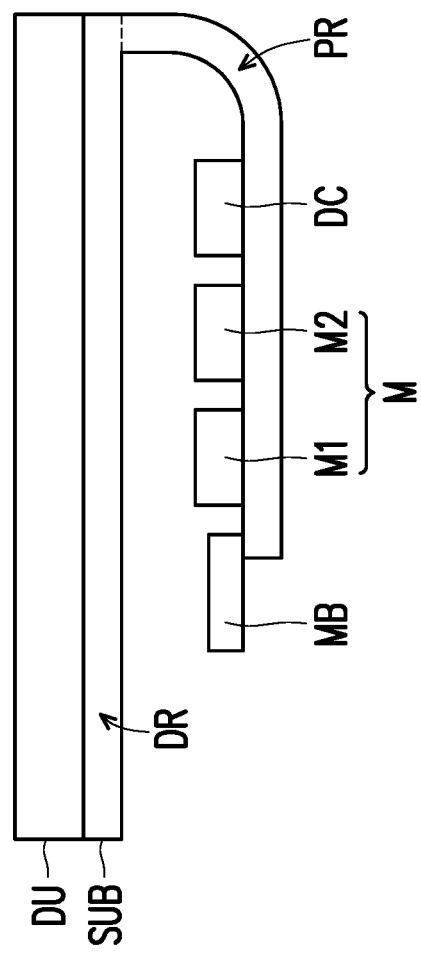
FIG. 2 is a cross-sectional view of the semiconductor package according to another embodiment of the invention.
Figure 5:
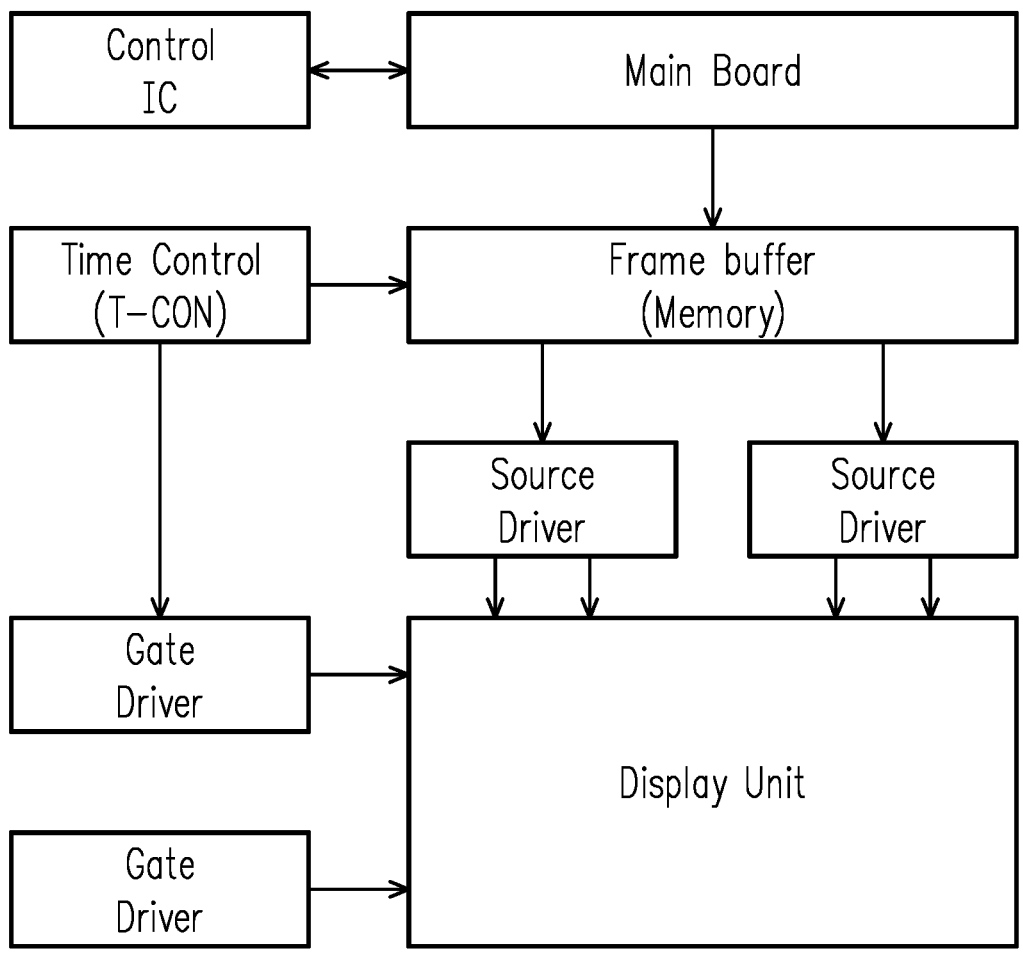
FIG. 5 is a schematic diagram illustrating the signal connection of the driving circuit, memory, and display unit of the semiconductor package according to an embodiment of the invention.

FIG. 1 is a cross-sectional view of the semiconductor package according to an embodiment of the invention. FIG. 2 is a cross-sectional view of the semiconductor package according to another embodiment of the invention. FIG. 5 is a schematic diagram illustrating the signal connection of the driving circuit, memory, and display unit of the semiconductor package according to an embodiment of the invention.

Referring to FIG. 1 and FIG. 2, semiconductor packages 100 and 200 include a substrate SUB, a display unit DU, a driving circuit DC, and at least one memory M.

The substrate SUB may have display region DR and a peripheral region PR. The substrate SUB may be a rigid substrate or a flexible substrate. For instance, the rigid substrate may be glass, and the flexible substrate may be polyimide (PI), but the invention is not limited thereto.

Referring to FIG. 1 and FIG. 2, the display unit DU is disposed in the display region DR. The display unit DU may include a liquid crystal display (LCD), an organic light emitting diode (OLED), a Mini-LED display, or a Micro-LED display. In some embodiments, the display unit DU may include a plurality of pixel units arrayed on the substrate SUB and a plurality of signal lines (e.g., data line and scan line) interlaced with each other. Each of the pixel units may include an active element and a light emitting unit or a pixel electrode. The active element may include a gate, a source, and a drain, wherein the gate may be electrically connected with the corresponding signal line (e.g., gate line); and the source may be electrically connected with the corresponding signal line (e.g., data line); and the drain may be electrically connected with the corresponding light emitting unit or pixel electrode.

The driving circuit DC and the memory M are disposed in the peripheral region and spaced apart from each other, wherein the memory M is electrically connected with the driving circuit DC, and the driving circuit DC is electrically connected with the display unit DU. As such, the memory M can be served as a frame buffer to store image data temporarily, so that the driving circuit DC (e.g., the source driving circuit SD) are capable of handling a large amount of image data transmitted from a micro control unit (MCU) or a micro control unit integrated dynamic random access memory (MCU/DRAM). As a result, the semiconductor packages 100 and 200 may have characteristics of high operation speed and low power consumption so as to meet the frame rate requirement of the display unit DU having high resolution and high quality.

In addition, the driving circuit DC belongs to a high-voltage semiconductor element, however, the operating voltage of the memory M is similar to that of the general logic circuit, therefore, the requirements and/or limitations of designing the processes for the driving circuit DC and the memory M may be different. Accordingly, the integration of these two processes may have a certain degree of difficulty. Based on the above, under a circumstance that the driving circuit DC and the memory M are spaced apart from each other, the driving circuit DC and the memory M can be manufactured separately through different processes and then disposed respectively in the peripheral region PR of the substrate. As such, the semiconductor packages 100 and 200 as well as the driving circuit DC and the memory M may have good process flexibility.

The memory M may include a static random access memory (SRAM), a pseudo-SRAM, a dynamic random access memory (DRAM), a flash memory (Flash), an electronic erasable programmable read only memory (EEPROM), or a combination thereof. The driving circuit DC may include a source driving circuit.

In some embodiments, the memory M may be electrically connected with the driving circuit DC through the wiring structure of the substrate SUB, but the invention is not limited thereto. In some other embodiments, the memory M may be electrically connected with the driving circuit DC through MIPI. Based on the above, the memory M and the driving circuit DC are both disposed in the peripheral region PR of the substrate SUB and electrically connected to each other by the wiring structure in the substrate SUB or MIPI, and the driving circuit DC may be electrically connected with the display unit DU by the wiring structure in the substrate SUB or MIPI, therefore, the additional bus lines for connecting the driving circuit DC to the external memory element can be omitted. As a result, the transmission speed of image data is enhanced and the process for manufacturing the semiconductor package is simplified.

On the other hand, the functions of the mobile devices are becoming more and more diverse, and the interconnection interfaces between the chips and peripheral components are more complicated, therefore, the interface connection (e.g., MIPI) as described above is relatively importance. When developing mobile devices and network communication equipment, the interfaces between the chips disposed in the smart phones and tablets are usually incompatible, such that the signals of the interface circuit have to undergo multiple conversions, which not only increases the cost, but also reduces the transmission efficiency of the chip, thereby the RF wireless communication transmission performance of the network communication equipment may be directly affected. Based on the specification requirements of the MIPI promoted by the MIPI Alliance, the product developers may not only enhance the integrated design of the connections of the internal chips in the device, but also reduce the complexity of the integrated wirings of the chip and save the number of interface conversion components through the standardized interface, thereby the cost of the semi-finished product can be reduced and the time course of product development can be accelerated. Through the standard interface of the specification, the function module of the smart device can be used to meet the mainstream high-speed transmission interface in the market, and thus the integration of the function can be proceeded.

In some embodiments, as shown in FIG. 1, under a circumstance that the substrate SUB is a rigid substrate, the display region DR and the peripheral region PR can be configured at the same level, but the invention is not limited thereto. In some other embodiments, as shown in FIG. 2, under a circumstance that the substrate SUB is a flexible substrate, the display region DR and the peripheral region PR can be configured at the different level. For example, the peripheral region PR can be configured below the display region DR, so that the display panel of the semiconductor package 200 can have narrow border design. In addition, under a circumstance that the driving circuit DC can be electrically connected to the display unit DU by the wiring structure in the substrate SUB or MIPI, the connection members, such as flexible circuit board (FPC), connection pads, or bus lines, for electrically connecting the driving circuit DC located on the rear side of the display panel to the display unit DU located on the front side of the display panel can be omitted. Thereby, the display panel of the semiconductor package 200 can have narrower border as compared to the COF. In the present embodiment, the display unit DU can be overlapped with the driving circuit DC and the memory M.

In the present embodiment, the semiconductor packages 100 and 200 may include a main board MB electrically connected to the memory M and the driving circuit DC respectively. Namely, the main board MB may transmit the signals to the memory M and/or the driving circuit DC in the peripheral region PR. The main board MB may be, for example, printed circuit board (PCB) or a flexible printed circuit board (FPCB).

FIG. 3 is a cross-sectional view of the semiconductor package according to still another embodiment of the invention. A semiconductor package 300 shown in FIG. 3 is similar to the semiconductor package 100 shown in FIG. 1, the difference between the two is that, the semiconductor package 300 further includes a control circuit CC, therefore, the same or similar reference numbers are used in the drawings to represent the same or similar elements, and the detailed description, such as the relationship of connection, materials and processes, regarding the rest of identical or similar components has been provided above, which is not repeated hereinafter. FIG. 4 is a cross-sectional view of the semiconductor package according to yet another embodiment of the invention. A semiconductor package 400 shown in FIG. 4 is similar to the semiconductor package 200 shown in FIG. 2, the difference between the two is that, the semiconductor package 400 further includes a control circuit CC, therefore, the same or similar reference numbers are used in the drawings to represent the same or similar elements, and the detailed description, such as the relationship of connection, materials and processes, regarding the rest of identical or similar components has been provided above, which is not repeated hereinafter.

Referring to FIG. 3 and FIG. 4, the semiconductor packages 300 and 400 may optionally include a control circuit CC disposed in the peripheral region PR and electrically connected with the driving circuit DC and the main board MB respectively. In some embodiments, the control circuit CC may be electrically connected with the driving circuit DC and the main board MB respectively through the wiring structure in the substrate SUB, but the invention is not limited thereto. In some other embodiments, the control circuit CC may be electrically connected with the driving circuit DC and the main board MB respectively through MIPI. In the present embodiment, the control circuit CC may be spaced apart from the memory M and the driving circuit DC. The control circuit CC may include a digital (logic) integrated circuit or an analog integrated circuit. It should be noted that, FIG. 3 and FIG. 4 illustrate a semiconductor packages 300 and 400 with one control circuit CC as an exemplary embodiment to clearly describe the invention, but the invention is not limited thereto. In other embodiments, the amount of the control circuit CC may be plural.

In summary, the memory and the driving circuit of the semiconductor package of the present embodiment are disposed in the peripheral region of the substrate and electrically connected to each other, so that the driving circuit is capable of dealing a large amount of image data. As a result, the semiconductor package may have characteristics of high operation speed and low power consumption so as to meet the frame rate requirement of the display unit having high resolution and high quality.

On the other hand, since the driving circuit and the memory may be manufactured separately through different processes and then respectively disposed on the flexible substrate, the semiconductor package as well as the driving circuit and the memory may have good process flexibility.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor package, comprising:
   a substrate having a display region and a peripheral region;
   a display unit directly disposed on the display region of the substrate;
   a source driving circuit disposed on the peripheral region and electrically connected with the display unit;
   at least one frame buffer memory for the source driving circuit disposed on the peripheral region and spaced apart from the source driving circuit in a direction parallel to the substrate, wherein the at least one frame buffer memory is configured to store a first image data transmitting to the source driving circuit and is directly and electrically connected with the source driving circuit;
   a main board disposed on the peripheral region and electrically connected to the at least one frame buffer memory and the source driving circuit, wherein the main board is configured to transmit the first image data to the at least one frame buffer memory and a second image data to the source driving circuit directly; and
   a control circuit disposed on the peripheral region and electrically connected to the source driving circuit and the main board, wherein the control circuit does not directly and electrically connect to the at least one frame buffer memory,
   wherein the display region and the peripheral region are configured at a different level.

2. The semiconductor package according to claim 1, wherein the at least one frame buffer memory is electrically connected with the source driving circuit through a wiring structure of the substrate.

3. The semiconductor package to claim 1, wherein the at least one frame buffer memory is electrically connected with the source driving circuit through a mobile industry processor interface (MIPI).

4. The semiconductor package to claim 1, wherein the at least one frame buffer memory comprises a plurality of memories spaced apart from each other.

5. The semiconductor package according to claim wherein the peripheral region is configured below the display region, and the display unit overlaps with the at least one frame buffer memory and the source driving circuit.

6. The semiconductor package according to claim 1, wherein the control circuit is spaced from the at least one frame buffer memory and the source driving circuit.

7. The semiconductor package according to claim 1, wherein the control circuit comprises a logic integrated circuit, an analog integrated circuit, or a combination thereof.

8. The semiconductor package according to claim 1, wherein the substrate comprises a flexible substrate or a rigid substrate.

9. The semiconductor package according to claim 1, wherein the at least one frame buffer memory comprises a static random access memory (SRAM), a pseudo-SRAM, a dynamic random access memory (DRAM), a flash memory, an electrically erasable and programmable read only memory (EEPROM), or a combination thereof.

10. The semiconductor package according to claim 1, wherein the display unit comprises a liquid crystal display (LCD), an organic light emitting diode (OLED), a Mini-LED display, or a Micro-LED display.

* * * * *